United States Patent
Tanaka et al.

(10) Patent No.: US 10,741,594 B2
(45) Date of Patent: Aug. 11, 2020

(54) IMAGING ASSEMBLY, METHOD AND MOLDING MOLD FOR FABRICATING SAME, CAMERA MODULE, AND SMART TERMINAL

(71) Applicant: Ningbo Sunny Opotech Co., Ltd., Ningbo (CN)

(72) Inventors: Takehiko Tanaka, Ningbo (CN); Lifeng Yao, Ningbo (CN); Bojie Zhao, Ningbo (CN); Zhewen Mei, Ningbo (CN)

(73) Assignee: Ningbo Sunny Opotech Co., Ltd. (CN)

( * ) Notice: Subject to any disclaimer, the term of this patent is extended or adjusted under 35 U.S.C. 154(b) by 89 days.

(21) Appl. No.: 16/102,156

(22) Filed: Aug. 13, 2018

(65) Prior Publication Data

US 2019/0051687 A1 Feb. 14, 2019

(30) Foreign Application Priority Data

Aug. 14, 2017 (CN) .......................... 2017 1 0693245

(51) Int. Cl.
*H01L 27/146* (2006.01)
*H01L 31/0203* (2014.01)

(52) U.S. Cl.
CPC .... *H01L 27/14618* (2013.01); *H01L 27/1469* (2013.01); *H01L 27/14621* (2013.01); *H01L 27/14625* (2013.01); *H01L 27/14634* (2013.01); *H01L 27/14685* (2013.01); *H01L 31/0203* (2013.01)

(58) Field of Classification Search
CPC .......... H01L 27/14618; H01L 27/1469; H01L 27/14634; H01L 27/14625; H01L 27/14685; H01L 27/14621; H01L 31/0203
USPC ...................................................... 257/433
See application file for complete search history.

(56) References Cited

U.S. PATENT DOCUMENTS

2005/0012032 A1* 1/2005 Onodera ............. H01L 21/4832
250/214.1

* cited by examiner

*Primary Examiner* — Fernando L Toledo
*Assistant Examiner* — Adam S Bowen
(74) *Attorney, Agent, or Firm* — Barnes & Thornburg LLP

(57) ABSTRACT

The present application provides an imaging assembly, a method and molding mold for fabricating same, a camera module, and a smart terminal. According to an aspect of the present application, the imaging assembly includes a photosensitive element and a molded encapsulation portion. The photosensitive element has a photosensitive area. The molded encapsulation portion is formed around the photosensitive area and is in contact with the photosensitive element. The molded encapsulation portion has an inclined inner side surface and a top surface higher than the photosensitive area. A height difference between the top surface of the molded encapsulation portion and the photosensitive area of the photosensitive element is less than or equal to 0.7 mm, and the inclined inner side surface and the top surface have different surface roughnesses.

19 Claims, 8 Drawing Sheets

IMAGING ASSEMBLY, METHOD AND MOLDING MOLD FOR FABRICATING SAME, CAMERA MODULE, AND SMART TERMINAL

CROSS-REFERENCE TO RELATED APPLICATION

This application claims priority to and the benefit of Chinese application No. 201710693245.0, filed on Aug. 14, 2017 in the State Intellectual Property Office of China, the disclosure of which is incorporated herein in its entirety by reference.

TECHNICAL FIELD

The present application relates to the technical field of imaging assemblies and smart terminals.

BACKGROUND

The structure of a camera module fabricated using the conventional chip onboard (COB) process is formed by assembling a circuit board, a photosensitive chip, a camera base, a motor drive, and a lens assembly, while other electronic components are disposed on the surface layer of the circuit board.

Currently, the proportion of the photosensitive area of existing photosensitive chips is increasing, and the edge of the photosensitive area is becoming closer to the side wall of the light window. Since the side wall of the light window is quite close to the photosensitive area, the intensity of external light reflected by the side wall of the light window onto the photosensitive area becomes higher, which makes the stray light stronger, thereby affecting the imaging quality of the camera module.

SUMMARY

The present application provides an imaging assembly, a method and molding mold for fabricating the same, a camera module, and a smart terminal.

According to an aspect of the present application, there is provided an imaging assembly, comprising: a photosensitive element, having a photosensitive area; and a molded encapsulation portion, formed around the photosensitive area and in contact with the photosensitive element, and the molded encapsulation portion has an inclined inner side surface and a top surface higher than the photosensitive area, wherein a height difference between the top surface of the molded encapsulation portion and the photosensitive area of the photosensitive element is less than or equal to 0.7 mm, and the inclined inner side surface has a different surface roughness from the top surface.

According to an aspect of the present application, there is provided a method for fabricating an imaging assembly, comprising: mounting a photosensitive element on a circuit board of an imaging assembly to be fabricated; attaching a flexible film to a lower portion of a molding mold, wherein the flexible film has a non-smooth surface facing away from the molding mold, the lower portion of the molding mold comprises a pressure head and a module portion located around the pressure head, and the pressure head has an inwardly inclined surface at an edge thereof; disposing the molding mold with the flexible film onto the photosensitive element, so that a height difference between a bottom surface of the module portion facing the photosensitive element and a top surface of the photosensitive element is less than or equal to 0.7 mm; and molding a molded encapsulation portion around the photosensitive element, between the bottom surface of the module portion facing the photosensitive element and the top surface of the photosensitive element, and surrounding the inwardly inclined surface at the edge of the pressure head, so that the inclined inner side surface formed on the molded encapsulation portion adjacent to the inwardly inclined surface has a non-smooth surface corresponding to the non-smooth surface of the flexible film attached on the inwardly inclined surface.

According to an aspect of the present application, there is provided a molding mold for fabricating an imaging assembly, comprising: a pressure head, having an inwardly inclined surface at an edge thereof; and a module portion, surrounding the pressure head, wherein an operational height difference between a bottom surface of the module portion adjacent to the pressure head and a bottom surface of the pressure head is less than or equal to 0.7 mm.

According to an aspect of the present application, there is provided a camera module, comprising the above-mentioned imaging assembly.

According to an aspect of the present application, there is provided a smart terminal, comprising the above-mentioned camera module.

According to an aspect of the present application, there is provided an imaging assembly, comprising: a photosensitive element, having a photosensitive area; a molded encapsulation portion, formed around the photosensitive area and in contact with the photosensitive element, and the molded encapsulation portion has an inclined inner side surface and a top surface higher than the photosensitive area; and a damping structure, located between the photosensitive element and the inclined inner side surface, wherein a height difference between the top surface of the molded encapsulation portion and a top of the damping structure is less than or equal to 0.7 mm, and the inclined inner side surface and the top surface of the molded encapsulation portion have different surface roughnesses.

According to an aspect of the present application, there is provided a method for fabricating an imaging assembly, comprising: mounting a photosensitive element on a circuit board of an imaging assembly to be fabricated; attaching a damping structure to the photosensitive element; attaching a flexible film to a lower portion of a molding mold, wherein the flexible film has a non-smooth surface facing away from the molding mold, the lower portion of the molding mold comprises a pressure head and a module portion located around the pressure head, and the pressure head has an inwardly inclined surface at an edge thereof; disposing the molding mold with the flexible film onto the damping structure, so that a height difference between a bottom surface of the module portion facing the photosensitive element and a top of the damping structure is less than or equal to 0.7 mm; and molding a molded encapsulation portion around the photosensitive element, between the bottom surface of the module portion facing the photosensitive element and the top surface of the photosensitive element, and surrounding the inwardly inclined surface at the edge of the pressure head, so that the inclined inner side surface formed on the molded encapsulation portion adjacent to the inwardly inclined surface has a non-smooth surface corresponding to the non-smooth surface of the flexible film attached on the inwardly inclined surface.

BRIEF DESCRIPTION OF THE DRAWINGS

Exemplary embodiments are shown in the accompanying drawings. The embodiments and accompanying drawings disclosed herein are provided for the purpose of description, and should not be construed as limiting.

FIG. 3b illustrates a variant of FIG. 3a;

FIG. 5b illustrates a variant of FIG. 5a;

FIG. 7b illustrates a variant of FIG. 7a;

DETAILED DESCRIPTION OF EMBODIMENTS

Figure 1:
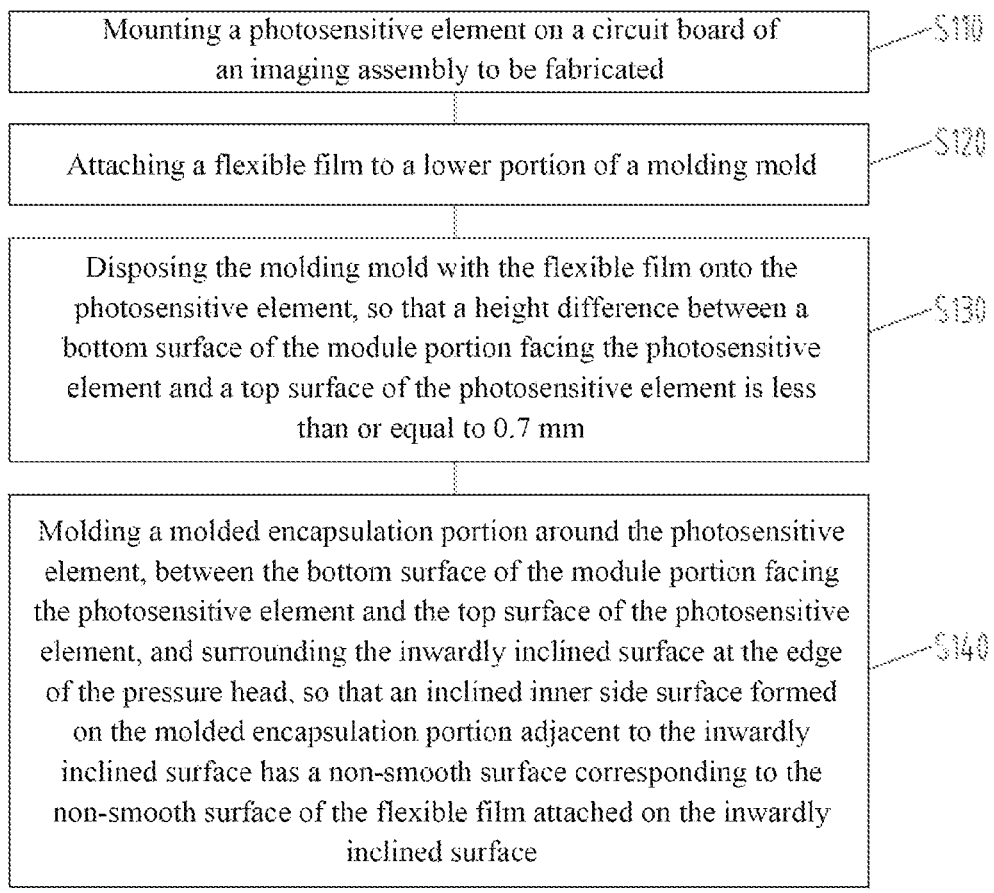
FIG. 1 illustrates a method for fabricating an imaging assembly according to an embodiment of the present application.

To facilitate the understanding of the present application, various aspects of the present application will be described in further detail with reference to the accompanying drawings. It should be understood that these detailed descriptions merely describe exemplary embodiments of the present application, and are not intended to limit the scope of the present application in any way. Throughout this specification, same reference numerals denote same parts. The term "and/or" includes any and all combinations of one or more of the associated listed items.

It should be noted that in this specification, the terms such as "first" and "second" are merely used for distinguishing one feature from another, and are not intended to impose any limitation on the features. Therefore, a first subject discussed below may also be referred to as a second subject without departing from the teaching of the present application.

In the accompanying drawings, for the convenience of illustration, the thicknesses, sizes, and shapes of objects are slightly exaggerated. The accompanying drawings are illustrative only and are not drawn strictly to scale.

It will be further understood that the terms "comprises," "comprising," "having," "includes," and/or "including," when used in this specification, specify the presence of stated features, steps, operations, elements, and/or components, but do not preclude the presence or addition of one or more other features, steps, operations, elements, components, and/or groups thereof. In addition, Expressions such as "at least one of," when preceding a list of elements, modify the entire list of features, rather than individual elements in the list. Moreover, when the embodiments of the present application are described, the term "may" is used to indicate "one or more embodiments of the present application". Furthermore, the term "exemplary" is used to refer to illustrative description or description by way of example.

As used herein, the terms "substantially", "about", and similar terms are used as terms of approximation and not as terms of degree, and are intended to account for the inherent deviations in measured or calculated values that would be recognized by those of ordinary skill in the art.

Unless otherwise defined, all terms (including technical and scientific terms) used herein have the same meaning as commonly understood by those of ordinary skill in the art to which the present application belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Orientational terms mentioned in the present application, such as up, down, left, right, front, and rear, are used to refer to the relative positions in the accompanying drawings for the convenience of description, and are not intended to limit the present application. In practice, the actual orientations of the parts shown in the accompanying drawings can be adjusted as required.

In the following descriptions, only parts related to improvements in the present application are correspondingly described, and many existing parts such as connection wires like gold wires and other commonly-seen components in the imaging assembly are omitted.

It should also be noted that the features in different embodiments of the present application may be combined with each other on a non-conflict basis, and the order of the steps in the method may be changed or the steps may take place concurrently. The present application will be described below in detail with reference to the accompanying drawings and in combination with the embodiments.

FIG. 1 illustrates a method for fabricating an imaging assembly according to an embodiment of the present application. As shown in FIG. 1, the method 100 includes steps S110 to S140.

Figure 2A:
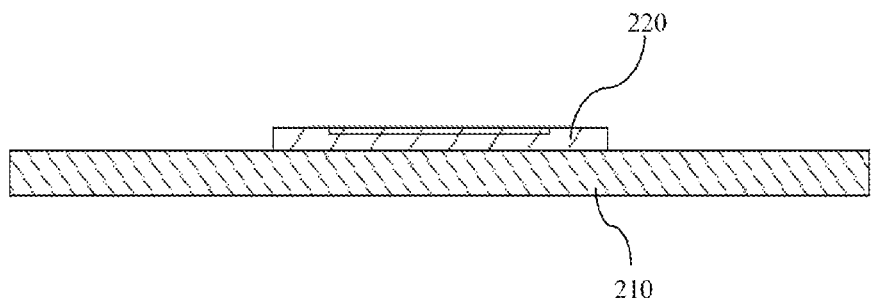
FIG. 2a is a schematic diagram of step S110 in FIG. 1.

In the step S110, a photosensitive element is mounted on a circuit board of an imaging assembly to be fabricated. FIG. 2a is a schematic diagram of the step S110. As shown in FIG. 2a, in the step S110, a photosensitive element 220 is mounted on a circuit board 210. The circuit board 210 is a part of a imaging assembly to be fabricated, and includes thereon circuits needed by the imaging assembly. The photosensitive element 220 is a sensor in the imaging assembly to be fabricated that is capable of sensing optical image information and converting it into a usable output signal.

Figure 2B:
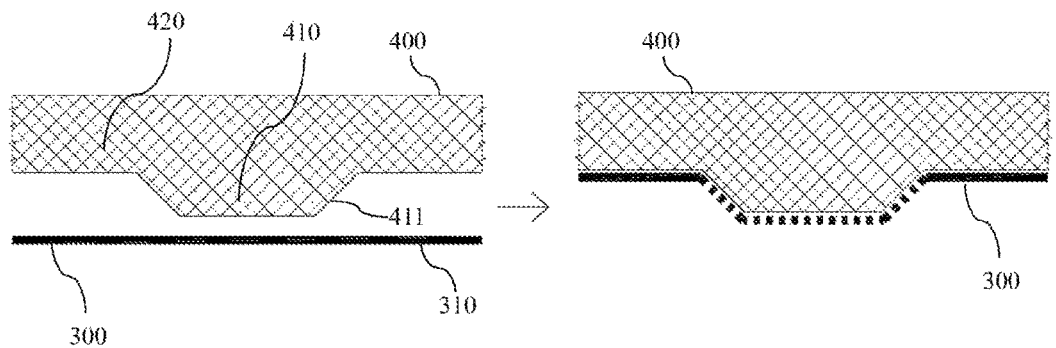
FIG. 2b is a schematic diagram of step S120 in FIG. 1.

Referring to FIG. 1, in the step S120, a flexible film is attached to a lower portion of a molding mold. FIG. 2b is a schematic diagram of the step S120. As shown in FIG. 2b, in the step S120, a flexible film 300 is attached to a lower portion of a molding mold 400 for fabricating an imaging assembly. A surface 310 of the flexible film 300 facing away from the molding mold 400 (that is, a surface substantially facing downwards) is a non-smooth surface. The lower portion of the molding mold 400 includes a pressure head 410 and a module portion 420. The module portion 420 is located around the pressure head 410, and the pressure head 410 has an inwardly inclined surface 411 at an edge thereof. Because the film 300 is flexible, when the flexible film 300 is attached to the lower portion of the molding mold 400, the part of the flexible film 300 attached to the pressure head 410 (shown by a dashed line in FIG. 2b) will be stretched to deform. Because the surface 310 of the flexible film 300 facing away from the molding mold 400 is a non-smooth surface, the part of the flexible film 300 attached to the pressure head 410 will cause its Ra (an arithmetic mean deviation of a surface roughness profile) to decrease due to being stretched that is, the surface roughness decreases.

Figure 2C:
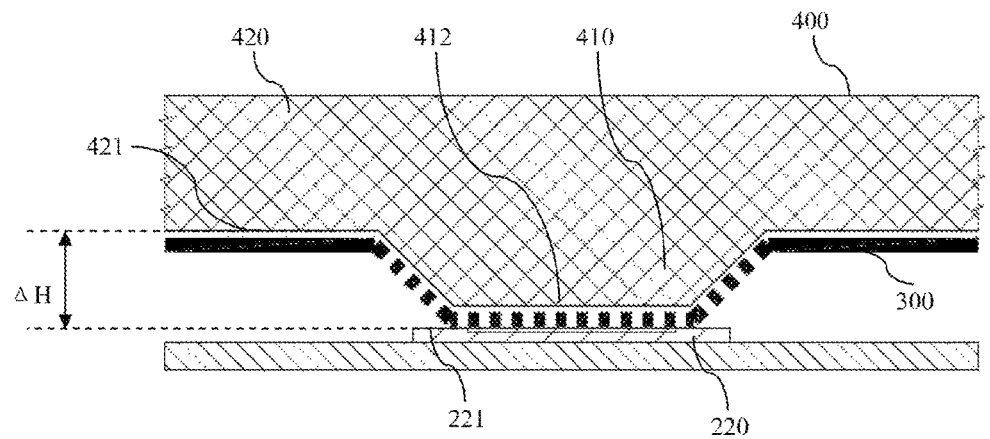
FIG. 2c is a schematic diagram of step S130 in FIG. 1.

Referring to FIG. 1, in the step S130, the molding mold to which the flexible film is attached is disposed onto the photosensitive element, so that a height difference between a bottom surface of the module portion facing the photosensitive element and a top surface of the photosensitive element is less than or equal to 0.7 mm. FIG. 2c is a schematic diagram of the step S130. As shown in FIG. 2c, in the step S130, the molding mold 400 with the flexible film 300 is disposed onto the photosensitive element 220, so that a height difference δH between a bottom surface 421 of the module portion 420 and a top surface 221 of the photosensitive element 220 is less than or equal to 0.7 mm. In the present application, the value of δH can be adjusted by adjusting the height difference between the bottom surface 412 of the pressure head 410 and the bottom surface 421 of the module portion 420 (at the design stage of the molding mold 400 or at the fabrication stage of the imaging assembly). Because the height difference between the bottom surface 412 and bottom surface 421 is adjusted during design or fabrication so that δH is less than or equal to 0.7 m, the flexible film 300 is stretched only to a small extent, so that the surface roughness of the surface 310 of the flexible film 300 only decreases slightly.

Figure 2D:
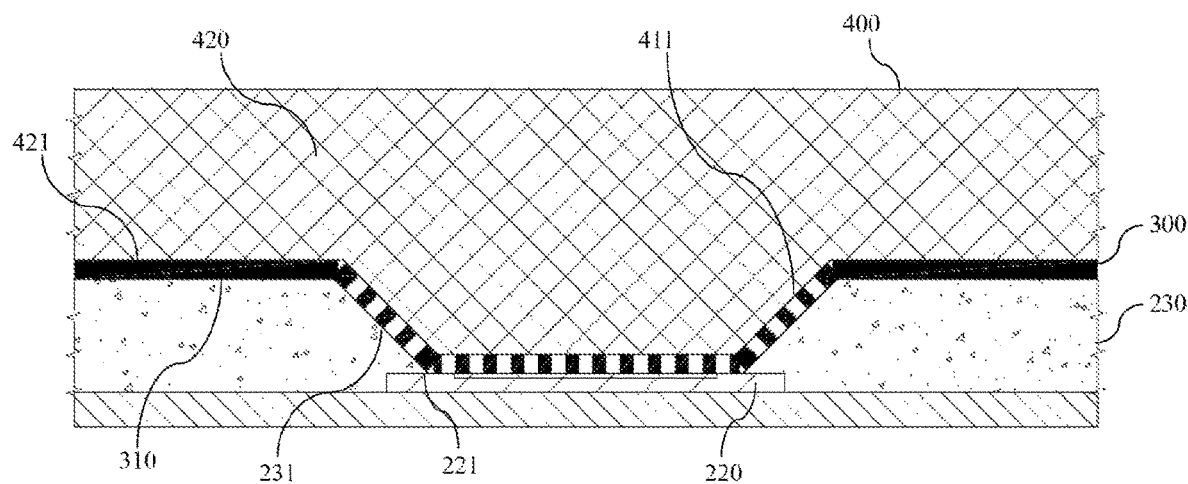
FIG. 2d is a schematic diagram of step S140 in FIG. 1.

Referring to FIG. 1, in the step S140, a molded encapsulation portion is molded around the photosensitive element, between the bottom surface of the module portion facing the photosensitive element and the top surface of the photosensitive element, and surrounding the inwardly inclined surface at the edge of the pressure head, so that inclined inner side surface formed on the molded encapsulation portion adjacent to the inwardly inclined surface has a non-smooth surface corresponding to the non-smooth surface of the flexible film attached on the inwardly inclined surface. FIG. 2d is a schematic diagram of the step S140. As shown in FIG. 2d, in the step S140, to prepare the imaging assembly, molding is performed around the photosensitive element 220 and between the bottom surface 421 of the module portion 420 facing the photosensitive element 220 and the top surface 221 of the photosensitive element 220 (for example, by using a material such as a thermosetting resin), so as to form a molded encapsulation portion 230 surrounding the inwardly inclined surface 411. In this way, because the flexible film 300 is attached on the lower portion of the molding mold 400 and the surface 310 of the flexible film 300 that substantially faces downwards is a non-smooth surface, inclined inner side surface 231 formed on the molded encapsulation portion 230 adjacent to the inwardly inclined surface 411 has a non-smooth surface corresponding to the non-smooth surface 310 of the flexible film 300 attached on the inwardly inclined surface 411.

After the step S140, routine procedures such as demolding may further be performed to obtain the imaging assembly.

In this way, because the height difference between the bottom surface of the module portion facing the photosensitive element and the top surface of the photosensitive element is controlled to be less than or equal to 0.7 mm during the fabrication of the imaging assembly, the flexible film is stretched only to a small extent during fabrication, so that the surface roughness of the lower surface of the flexible film only decreases slightly. Therefore, the inclined inner side surface of the molded encapsulation portion in the fabricated imaging assembly also has a desirable surface roughness to inhibit the reflection of light by the inclined inner side surface onto the photosensitive area of the photosensitive element, thereby effectively controlling the impact of stray light on the photosensitive element.

According to an embodiment of the present application, referring to FIG. 2d, a reflectance of the inclined inner side surface 231 of the molded encapsulation portion 230 to visible light is less than or equal to 5%. As described above, because of the improvement of the fabrication process, the inclined inner side surface of the molded encapsulation portion has a desirable surface roughness. Therefore, the reflectance of the inclined inner side surface decreases to a low level, so that the reflection of light by the inclined inner side surface is reduced.

According to an embodiment of the present application, the value of Ra (an arithmetic mean deviation of a surface roughness profile) of the inclined inner side surface 231 of the molded encapsulation portion 230 is greater than or equal to 1 μm.

According to an embodiment of the present application, the Ra value of the non-smooth surface of the flexible film 300 attached on the module portion 420 is greater than the Ra value of the non-smooth surface of the flexible film 300 attached on the inwardly inclined surface 411. As described above, during the fabrication of the imaging assembly, the part of the flexible film 300 attached on the pressure head 410 will be deformed, while the part of the flexible film 300 attached on the module portion 420 will not or hardly be deformed. Therefore, the Ra value of the non-smooth surface of the flexible film 300 attached on the module portion 420 is greater than the Ra value of the non-smooth surface of the flexible film 300 attached on the inwardly inclined surface 411.

According to an embodiment of the present application, the step S130 includes: pressing the pressure head with the flexible film directly against the photosensitive area of the photosensitive element. Because the molded encapsulation portion of the imaging assembly will be formed around the photosensitive area of the photosensitive element, and the molding material needs to be prevented from flowing onto the photosensitive area during molding, the pressure head with the flexible film can be pressed directly against the photosensitive area of the photosensitive element. Because the flexible film is elastic due to its flexibility, pressing the pressure head against the photosensitive area can provide a good barrier to prevent the molding material from entering the photosensitive area.

According to an embodiment of the present application, an angle of inclination of the inwardly inclined surface 411 with respect to the photosensitive area of the photosensitive element is between 20 and 70 degrees.

According to an embodiment of the present application, a stretching coefficient K is used to represent the degree to which the flexible film is stretched during the fabrication of the imaging assembly. A larger K indicates a higher degree to which the flexible film is stretched. K is represented by the following formula:

$$K=1+2d(1/\sin\alpha-1/\tan\alpha)/(b_1+2b_2) \quad (1)$$

where d represents a height difference between the bottom surface of the module portion facing the photosensitive element and the top surface of the photosensitive element, a represents an angle of inclination of the inwardly inclined surface with respect to the top surface of the photosensitive element, $b_1$ represents a distance between the inwardly inclined surfaces of the pressure head, and $b_2$ represents a length of an orthographic projection of the inwardly inclined surface on the top surface of the photosensitive element.

Figure 3A:
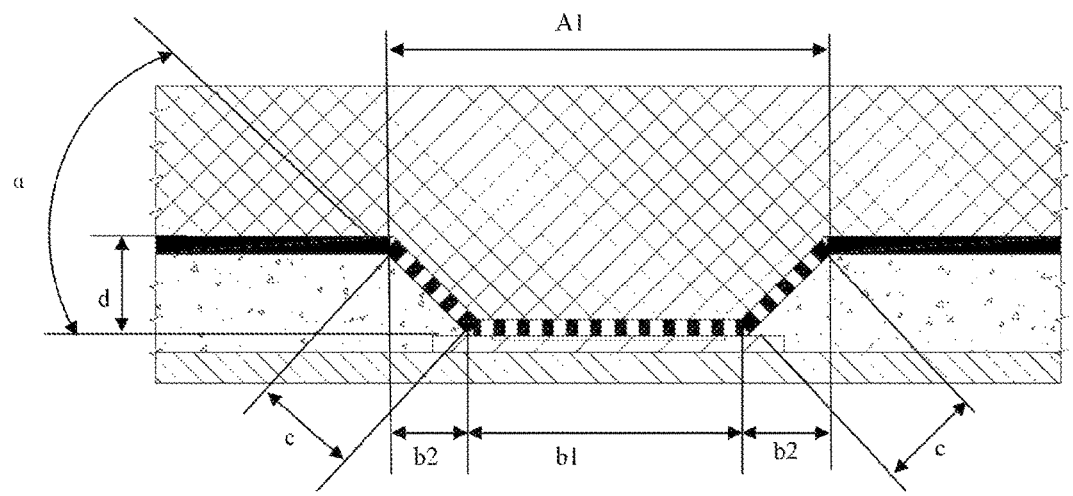
FIG. 3a illustrates the physical meaning of formula (1)

FIG. 3a illustrates the physical meaning of the above-mentioned formula (1). As shown in FIG. 3a, A1 represents a length of the part of the flexible film attached on the pressure head before being stretched. A2 (not shown) is used to represent a length of the part attached on the pressure head after being stretched. It can be seen that $A1=b_1+2b_2$, and $A2=b_1+2c$. In this implementation, the stretching coefficient K of the flexible film is defined as $K=A2/A1=(b_1+2c)/(b_1+2b_2)$. The above-mentioned formula (1) can be obtained by deduction.

According to the foregoing description, d (that is, δH) 0.7 mm, $20° \le \alpha \le 70°$. Limited by design and/or process conditions, $b_1+2b_2 \ge 2.48$ mm. Therefore, according to this implementation, the stretching coefficient K of the flexible film is less than or equal to 1.4.

Because the value of K represents the degree to which the flexible film is stretched during the fabrication of the imaging assembly, controlling the value of K to be within a certain range can prevent an excessive decrease in surface roughness of the flexible film due to undue stretching. In this way, it is ensured that the inclined inner side surface of the molded encapsulation portion in the fabricated imaging assembly also has a desirable surface roughness to inhibit the reflection of light by the inclined inner side surface onto the photosensitive area of the photosensitive element, thereby effectively controlling the impact of stray light on the photosensitive element.

Figure 3B:
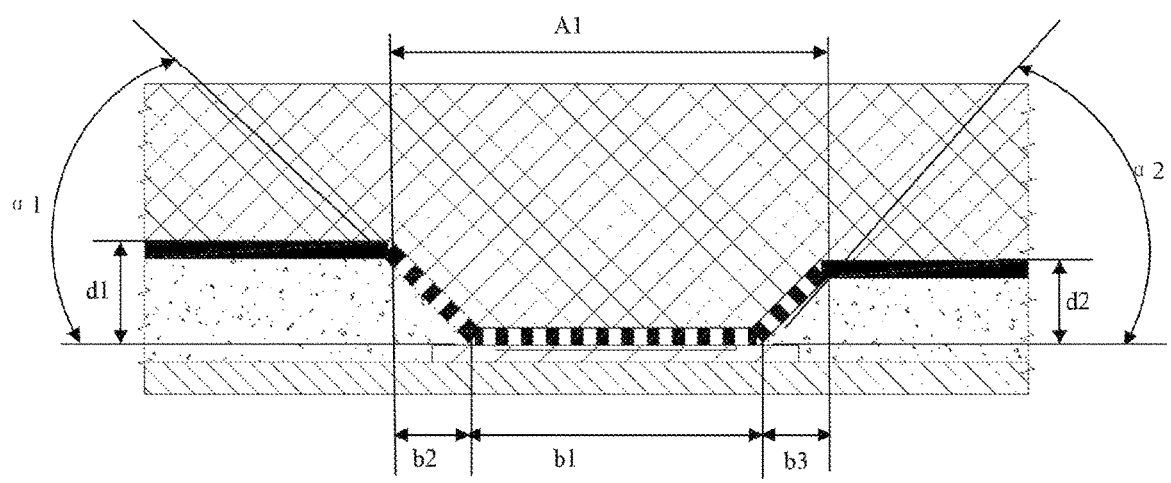

FIG. 3b illustrates a variant of FIG. 3a. According to the implementation shown in FIG. 3b, K may be represented by the following formula:

$$K=1+(d_1(1/\sin \alpha_1-1/\tan \alpha_1)+d_2(1/\sin \alpha_2-1/\tan \alpha_2))/(b_1+b_2+b_3) \quad (1')$$

As shown in FIG. 3b, $d_1$ and $d_2$ represent height differences between the bottom surface of the module portion facing the photosensitive element and the top surface of the photosensitive element, $\alpha_1$ and $\alpha_2$ represent angles of inclination of the inwardly inclined surface with respect to the top surface of the photosensitive element, $b_1$ represents a distance between the inwardly inclined surfaces of the pressure head, and $b_2$ and $b_3$ represent lengths of orthographic projections of the inwardly inclined surface on the top surface of the photosensitive element.

The difference between the implementations shown in FIG. 3b and FIG. 3a lies in that the implementation shown in FIG. 3a is a case of the implementation shown in FIG. 3b when $d_1=d_2$, $\alpha_1=\alpha_2$, and $b_2=b_3$.

According to an embodiment of the present application, the flexible film has an anti-adhesive surface facing toward the molding mold, to facilitate the separation of the molding mold from the imaging assembly during the demolding operation after molding.

According to an embodiment of the present application, the flexible film is made of one or more materials selected from group consisting of ETFE, PTFE, PFA, FEP, and PS. All of such materials can form an anti-adhesive surface, and have such characteristics as good resistance to staining, high toughness, ease of separation, and high-temperature resistance, thereby facilitating the operation of the flexible film.

Figure 4:
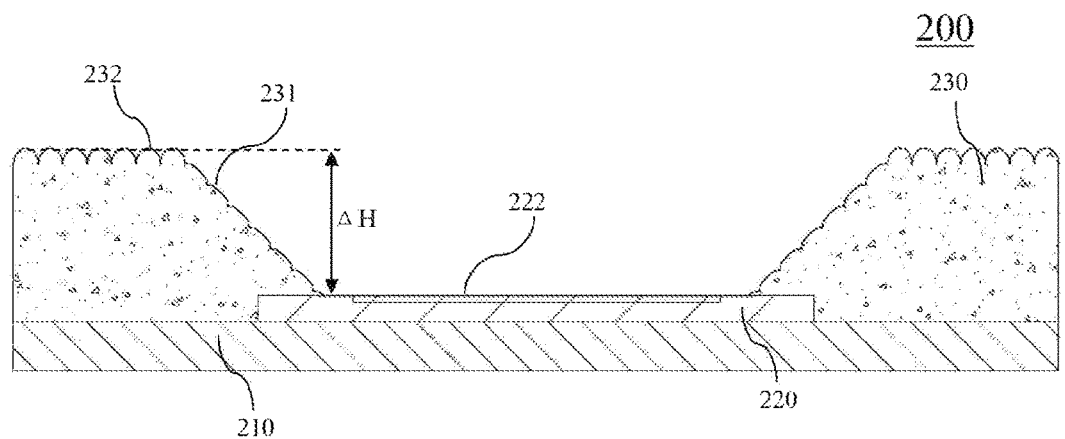
FIG. 4 is a cross-sectional view of an imaging assembly according to an embodiment of the present application.

FIG. 4 is a cross-sectional view of an imaging assembly according to an embodiment of the present application. An imaging assembly 200 shown in FIG. 4 can be prepared by using the above-mentioned method 100. As shown in FIG. 4, the imaging assembly 200 may include a circuit board 210, a photosensitive element 220, and a molded encapsulation portion 230. The photosensitive element 220 may have a photosensitive area 222. The molded encapsulation portion 230 is formed around the photosensitive area 222 and is in contact with the photosensitive element 220. The molded encapsulation portion 230 has an inclined inner side surface 231 and a top surface 232 higher than the photosensitive area 222. A height difference δH between the top surface 232 of the molded encapsulation portion 230 and the photosensitive area 222 of the photosensitive element 220 is less than or equal to 0.7 mm, and the inclined inner side surface 231 and the top surface 232 have different surface roughnesses.

Because the height difference between the bottom surface of the module portion facing the photosensitive element and the top surface of the photosensitive element is controlled to be less than or equal to 0.7 mm during the fabrication of the imaging assembly, the height difference between the top surface of the molded encapsulation portion and the photosensitive area of the photosensitive element is less than or equal to 0.7 mm (in the present application, the influence of the thickness of the flexible film on the sizes of other elements can be ignored). The flexible film is stretched only to a small extent during molding, so that the surface roughness of the lower surface of the flexible film only decreases slightly. Accordingly, the inclined inner side surface of the molded encapsulation portion in the fabricated imaging assembly has a desirable surface roughness. Although the inclined inner side surface and the top surface of the molded encapsulation portion have different surface roughnesses (and therefore have different reflectances), the inclined inner side surface still has a desirable surface roughness, and therefore the reflection of light by the inclined inner side surface onto the photosensitive area of the photosensitive element can be inhibited, thereby the impact of stray light on the photosensitive element is effectively controlled.

According to an embodiment of the present application, a reflectance of the inclined inner side surface 231 of the molded encapsulation portion 230 to visible light is less than or equal to 5%.

According to an embodiment of the present application, the value of Ra of the inclined inner side surface 231 of the molded encapsulation portion 230 is greater than or equal to 1 μm.

According to an embodiment of the present application, the Ra value of the top surface 232 of the molded encapsulation portion 230 is greater than the Ra value of the inclined inner side surface 231.

According to an embodiment of the present application, an angle of inclination of the inclined inner side surface 231 with respect to the photosensitive area 222 is between 20 and 70 degrees.

According to an embodiment of the present application, the molded encapsulation portion 230 has a size that satisfies the following in equation:

$$5d(1/\sin \alpha - 1/\tan \alpha) \le (b_1+2b_2) \quad (2)$$

Figure 5A:
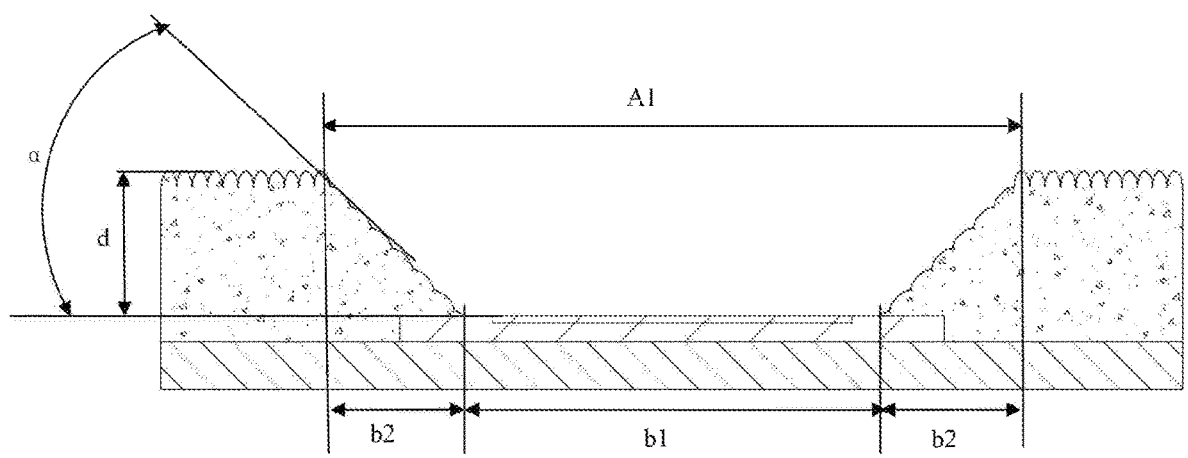
FIG. 5a illustrates the meanings of parameters in formula (2)

FIG. 5a illustrates the meanings of parameters in the above-mentioned formula (2). In the formulas (2) and (1), same signs are used to indicate same or similar parameters. As shown in FIG. 5a, d represents a height difference between the top surface of the molded encapsulation portion and the photosensitive area of the photosensitive element, a represents an angle of inclination of the inclined inner side surface with respect to the photosensitive area, $b_1$ represents a distance between the opposite inclined inner side surfaces on the photosensitive area, and $b_2$ represents a length of an orthographic projection of the inclined inner side surface on a plane encompassing the photosensitive area.

It can be known from the above description of the formula (1) that $1+2d(1/\sin \alpha - 1/\tan \alpha)/(b_1+2b_2) \leq 1.4$, Therefore, the formula (2) can be obtained by deduction.

Figure 5B:
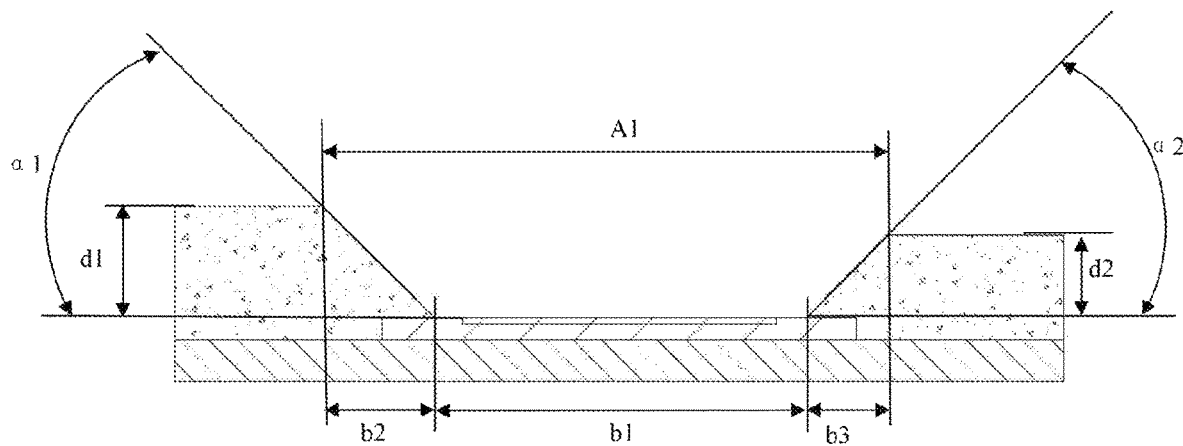

FIG. 5b illustrates a variant of FIG. 5a. According to the implementation shown in FIG. 5b, the molded encapsulation portion 230 has a size that satisfies the following in equation:

$$d_1(1/\sin \alpha_1 - 1/\tan \alpha_1) + d_2(1/\sin \alpha_2 - 1/\tan \alpha_2) \leq 0.4(b_1+b_2+b_3) \quad (2')$$

As shown in FIG. 5b, $d_1$ and $d_2$ represent height differences between the top surface of the molded encapsulation portion and the photosensitive area of the photosensitive element, $\alpha_1$ and $\alpha_2$ represent angles of inclination of the inclined inner side surface with respect to the photosensitive area, $b_1$ represents a distance between the opposite inclined inner side surfaces on the photosensitive area, and $b_2$ and $b_3$ represent lengths of orthographic projections of the inclined inner side surface on a plane encompassing the photosensitive area.

The difference between the implementations shown in FIG. 5b and FIG. 5a lies in that the implementation shown in FIG. 5a is a case of the implementation shown in FIG. 5b when $d_1=d_2$, $\alpha_1=\alpha_2$, and $b_2=b_3$.

Figure 6:
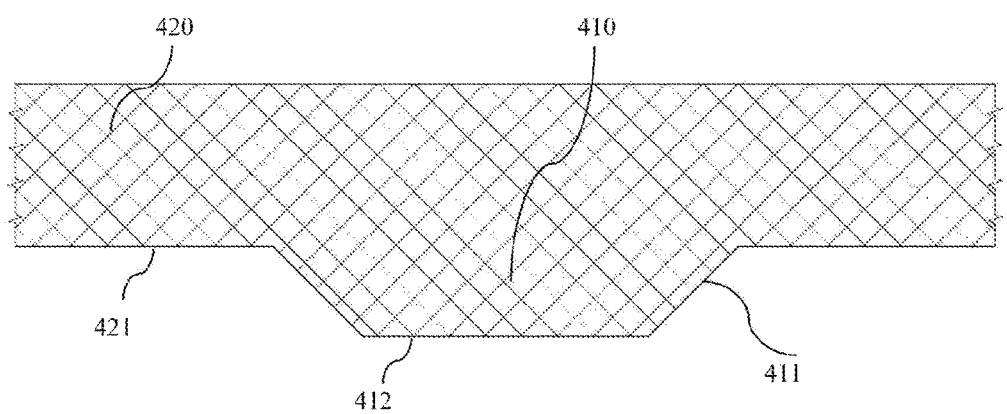
FIG. 6 is a cross-sectional view of a molding mold for fabricating an imaging assembly according to an embodiment of the present application.

FIG. 6 is a cross-sectional view of a molding mold for fabricating an imaging assembly according to an embodiment of the present application. The molding mold can be used in the method 100 shown in FIG. 1. As shown in FIG. 6, the molding mold 400 may include a pressure head 410 and a module portion 420. The pressure head 410 has an inwardly inclined surface 411 at an edge thereof, and the module portion 420 surrounds the pressure head 410. An operational height difference between a bottom surface 421 of the module portion 420 adjacent to the pressure head 410 and a bottom surface 412 of the pressure head 410 is less than or equal to 0.7 mm.

In this way, when the imaging assembly is fabricated using the above-mentioned molding mold, because the operational height difference between the bottom surface 421 of the module portion 420 adjacent to the pressure head 410 and the bottom surface 412 of the pressure head 410 is less than or equal to 0.7 mm, the flexible film, when being attached to the molding mold, is stretched only to a small extent, so that the surface roughness of the lower surface of the flexible film only decreases slightly. Therefore, the inclined inner side surface of the molded encapsulation portion in the fabricated imaging assembly also has a desirable surface roughness to inhibit the reflection of light by the inclined inner side surface onto the photosensitive area of the photosensitive element, thereby effectively controlling the impact of stray light on the photosensitive element.

According to an embodiment of the present application, an angle of inclination of the inwardly inclined surface 411 with respect to the bottom surface 412 of the pressure head 410 is between 20 and 70 degrees.

According to an embodiment of the present application, the molding mold 400 has a size that satisfies the following in equation:

$$5d(1/\sin \alpha - 1/\tan \alpha) \leq (b_1+2b_2) \quad (3)$$

Figure 7A:
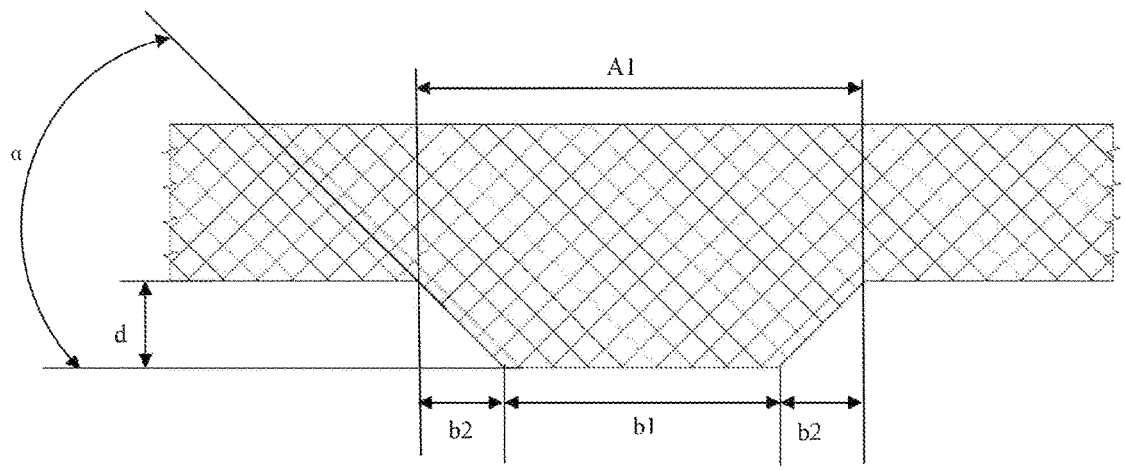
FIG. 7a illustrates the meanings of parameters in formula (3)

FIG. 7a illustrates the meanings of parameters in the above-mentioned formula (3). In the formulas (3) and (1), same signs are used to indicate same or similar parameters. As shown in FIG. 7a, d represents an operational height difference between the bottom surface of the module portion adjacent to the pressure head and the bottom surface of the pressure head, a represents an angle of inclination of the inwardly inclined surface with respect to the bottom surface of the pressure head, $b_1$ represents a distance between the inwardly inclined surfaces of the pressure head, and $b_2$ represents a length of an orthographic projection of the inwardly inclined surface on a plane encompassing the bottom surface of the pressure head.

It can be known from the above description of the formula (1) that $1+2d(1/\sin \alpha - 1/\tan \alpha)/(b_1+2b_2) \leq 1.4$, Therefore, the formula (3) can be obtained by deduction.

Figure 7B:
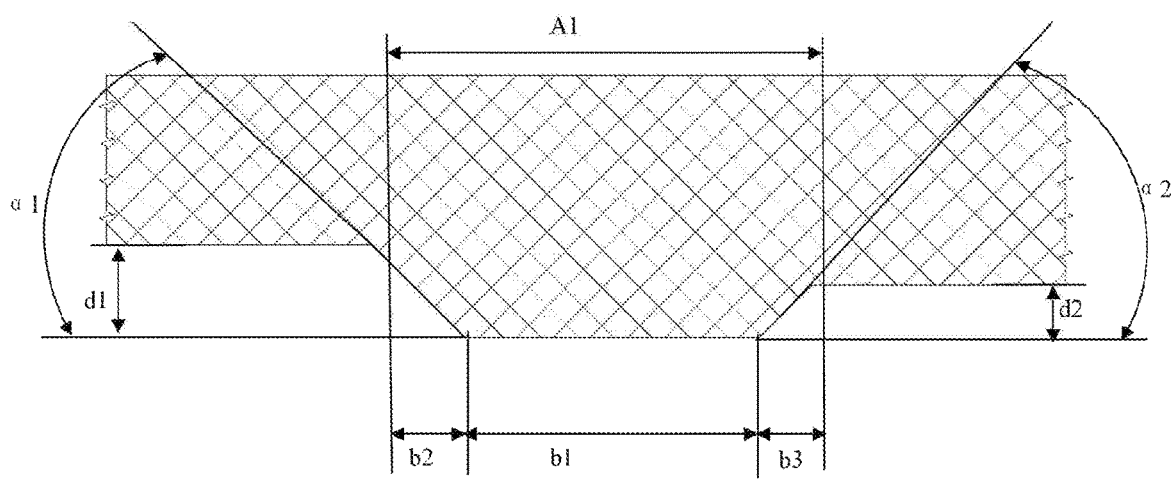

FIG. 7b illustrates a variant of FIG. 7a. According to the implementation shown in FIG. 7b, the molding mold 400 has a size that satisfies the following in equation:

$$d_1(1/\sin \alpha_1 - 1/\tan \alpha_1) + d_2(1/\sin \alpha_2 - 1/\tan \alpha_2) \leq 0.4(b_1+b_2+b_3) \quad (3')$$

As shown in FIG. 7b, $d_1$ and $d_2$ represent operational height differences between the bottom surface of the module portion adjacent to the pressure head and the bottom surface of the pressure head, $\alpha_1$ and $\alpha_2$ represent angles of inclination of the inwardly inclined surface with respect to the bottom surface of the pressure head, $b_1$ represents a distance between the inwardly inclined surfaces of the pressure head, and $b_2$ and $b_3$ represents lengths of orthographic projections of the inwardly inclined surface on a plane encompassing the bottom surface of the pressure head.

The difference between the implementations shown in FIG. 7b and FIG. 7a lies in that the implementation shown in FIG. 7a is a case of the implementation shown in FIG. 7b when $d_1=d_2$, $\alpha_1=\alpha_2$, and $b_2=b_3$.

According to an embodiment of the present application, a camera module is provided, which may include the above-mentioned imaging assembly.

According to another embodiment of the present application, a smart terminal is provided, which may include the above-mentioned camera module.

Figure 8:
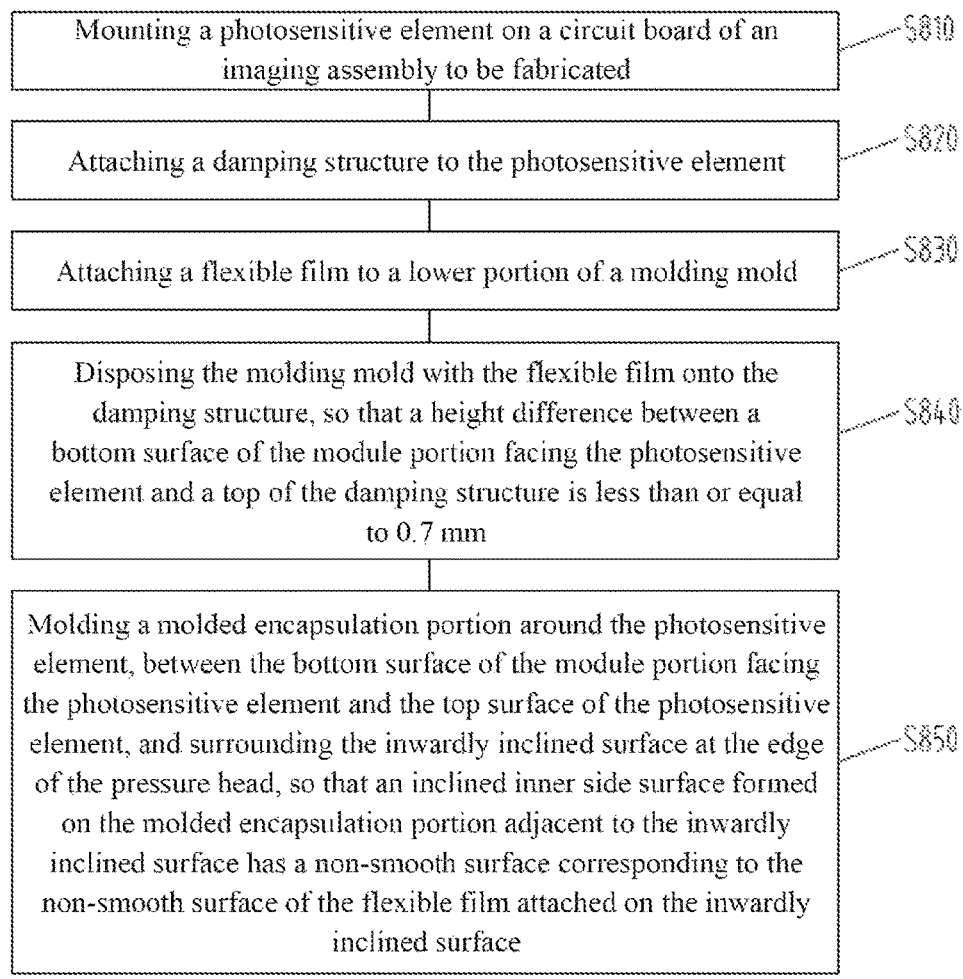
FIG. 8 illustrates a method for fabricating an imaging assembly according to another embodiment of the present application.

FIG. 8 illustrates a method for fabricating an imaging assembly according to another embodiment of the present application. As shown in FIG. 8, the method 800 includes steps S810 to S850.

In the step S810, a photosensitive element is mounted on a circuit board of an imaging assembly to be fabricated. This step is the same as or similar to the step S110, and will not be repeatedly described here.

In the step S820, a damping structure is attached to the photosensitive element. The damping structure can be used for protecting the photosensitive element and/or components such as connection wires from impact.

In the step S830, a flexible film is attached to a lower portion of a molding mold. The flexible film has a non-smooth surface facing away from the molding mold. The lower portion of the molding mold includes a pressure head and a module portion located around the pressure head, and the pressure head has an inwardly inclined surface at an edge thereof. This step is the same as or similar to the step S120, and will not be repeatedly described here.

In the step S840, the molding mold with the flexible film is disposed onto the photosensitive element, so that a height difference between a bottom surface of the module portion facing the photosensitive element and a top surface of the damping structure is less than or equal to 0.7 mm. This step is similar to the step S130, and the difference lies in that the damping structure is introduced in the step S820; therefore, in the step S840, the molding mold with the flexible film needs to be disposed on the damping structure, rather than on the photosensitive element, and the height difference between the bottom surface of the module portion facing the photosensitive element and the top of the damping structure is less than or equal to 0.7 mm.

In the step S850, a molded encapsulation portion is molded around the photosensitive element, between the bottom surface of the module portion facing the photosensitive element and the top surface of the photosensitive element, and surrounding the inwardly inclined surface at the edge of the pressure head, so that an inclined inner side surface formed on the molded encapsulation portion adjacent to the inwardly inclined surface has a non-smooth surface corresponding to the non-smooth surface of the flexible film attached on the inwardly inclined surface. This step is the same as or similar to the step S140, and will not be repeatedly described here.

After the step S850, routine procedures such as demolding may further be performed, thus obtaining the imaging assembly.

According to an embodiment of the present application, the damping structure is a stepped adhesive and/or a filter element.

According to an embodiment of the present application, a reflectance of the inclined inner side surface of the molded encapsulation portion to visible light is less than or equal to 5%.

According to an embodiment of the present application, the value of Ra of the inclined inner side surface of the molded encapsulation portion is greater than or equal to 1 μm.

According to an embodiment of the present application, the Ra value of the non-smooth surface of the flexible film attached on the module portion is greater than the Ra value of the non-smooth surface of the flexible film attached on the inwardly inclined surface.

According to an embodiment of the present application, disposing the molding mold with the flexible film onto the damping structure includes: pressing the pressure head with the flexible film directly against the damping structure.

According to an embodiment of the present application, an angle of inclination of the inwardly inclined surface with respect to the photosensitive area is between 20 and 70 degrees.

According to an embodiment of the present application, after the flexible film is attached to the lower portion of the molding mold, a resulting stretching coefficient K of the flexible film is less than or equal to 1.4, where $$K=1+2d(1/\sin \alpha - 1/\tan \alpha)/(b_1+2b_2) \quad (4)$$

where d represents a height difference between the bottom surface of the module portion facing the photosensitive element and the top of the damping structure, α represents an angle of inclination of the inwardly inclined surface with respect to the photosensitive area, $b_1$ represents a distance between the inwardly inclined surfaces of the pressure head, and $b_2$ represents a length of an orthographic projection of the inwardly inclined surface on a plane encompassing the photosensitive area.

The difference between the above-mentioned formula (4) and formula (1) lies only in that in the formula (4), d represents the height difference between the bottom surface of the module portion facing the photosensitive element and the top of the damping structure; while in the formula (1), d represents the height difference between the bottom surface of the module portion facing the photosensitive element and the top surface of the photosensitive element.

According to an embodiment of the present application, after the flexible film is attached to the lower portion of the molding mold, a resulting stretching coefficient K of the flexible film is less than or equal to 1.4, where $$K=1+(d_1(1/\sin \alpha_1 - 1/\tan \alpha_1)+d_2(1/\sin \alpha_2 - 1/\tan \alpha_2))/(b_1+b_2+b_3) \quad (4')$$

where $d_1$ and $d_2$ represent height differences between the bottom surface of the module portion facing the photosensitive element and the top of the damping structure, $\alpha_1$ and $\alpha_2$ represent angles of inclination of the inwardly inclined surface with respect to the photosensitive area, $b_1$ represents a distance between the inwardly inclined surfaces of the pressure head, and $b_2$ and $b_3$ represent lengths of orthographic projections of the inwardly inclined surface on a plane encompassing the photosensitive area.

The difference between the above-mentioned formula (4') and formula (4) lies in that the implementation expressed by the formula (4) is a case of the implementation expressed by the formula (4') when $d_1=d_2$, $\alpha_1=\alpha_2$, and $b_2=b_3$.

According to an embodiment of the present application, the flexible film has an anti-adhesive surface facing toward the molding mold.

According to an embodiment of the present application, the flexible film is made of one or more materials selected from group consisting of ETFE, PTFE, PFA, FEP, and PS.

Figure 9:
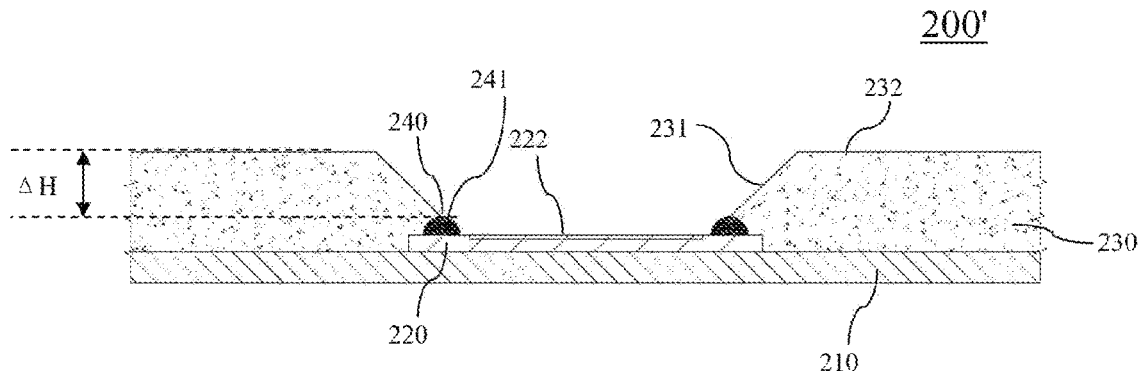
FIG. 9 is a cross-sectional view of an imaging assembly according to another embodiment of the present application.

FIG. 9 is a cross-sectional view of an imaging assembly according to another embodiment of the present application. An imaging assembly 200' shown in FIG. 9 can be prepared by using the above-mentioned method 800. As shown in FIG. 9, the imaging assembly 200' may include a circuit board 210, a photosensitive element 220, a molded encapsulation portion 230, and a damping structure 240. The photosensitive element 220 may have a photosensitive area 222. The molded encapsulation portion 230 is formed around the photosensitive area 222 and is in contact with the photosensitive element 220. The molded encapsulation portion 230 has an inclined inner side surface 231 and a top surface 232 higher than the photosensitive area 222. The damping structure 240 is located between the photosensitive element 220 and the inclined inner side surface 231. A height difference δH' between the top surface 232 of the molded encapsulation portion 230 and a top 241 of the damping structure 240 is less than or equal to 0.7 mm, and the inclined inner side surface 231 and the top surface 232 of the molded encapsulation portion 230 have different surface roughnesses.

Figure 10:
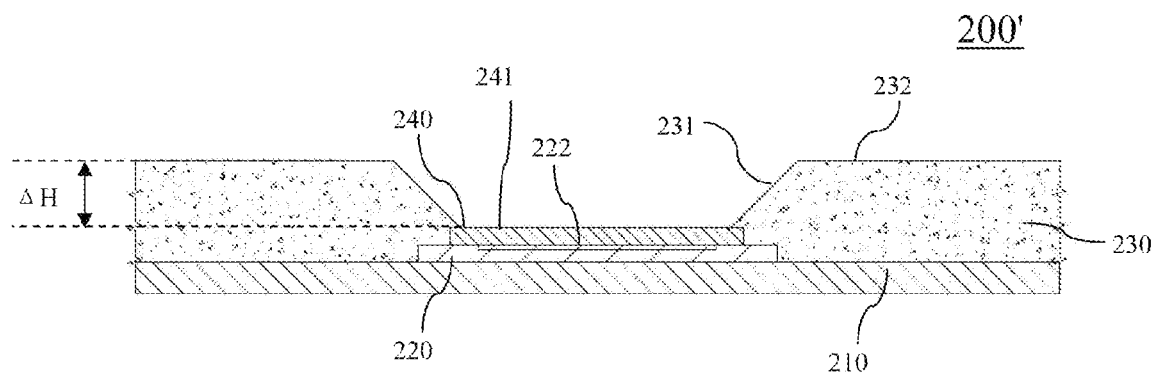
FIG. 10 illustrates a case where the damping structure in FIG. 9 is a filter element.
Figure 11:
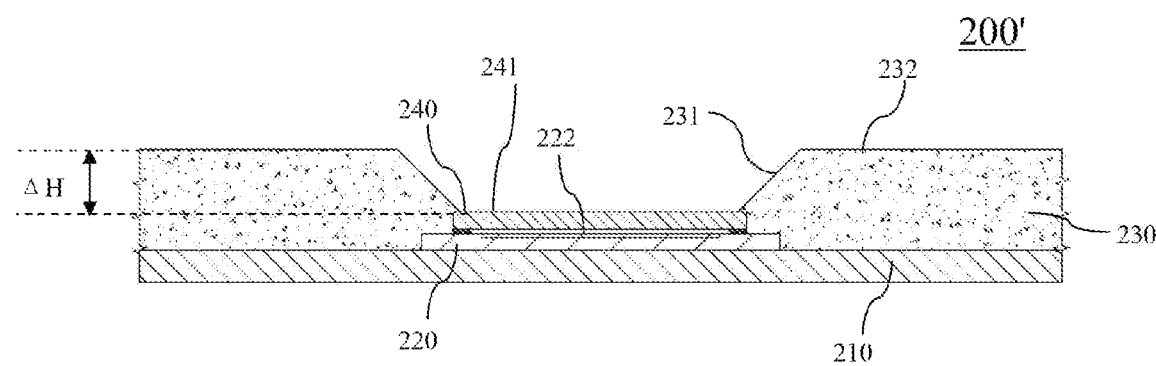
FIG. 11 illustrates a case where the damping structure in FIG. 9 is a stepped adhesive and a filter element.

According to an embodiment of the present application, the damping structure is a stepped adhesive and/or a filter element. The damping structure shown in FIG. 9 is a stepped adhesive. FIG. 10 illustrates a case where the damping structure in FIG. 9 is a filter element. FIG. 11 illustrates a case where the damping structure in FIG. 9 is a stepped adhesive and a filter element.

According to an embodiment of the present application, a reflectance of the inclined inner side surface of the molded encapsulation portion to visible light is less than or equal to 5%.

According to an embodiment of the present application, the Ra value of the inclined inner side surface of the molded encapsulation portion is greater than or equal to 1 μm.

According to an embodiment of the present application, the Ra value of the top surface of the molded encapsulation portion is greater than the Ra value of the inclined inner side surface.

According to an embodiment of the present application, an angle of inclination of the inclined inner side surface with respect to the photosensitive area is between 20 and 70 degrees.

According to an embodiment of the present application, the molded encapsulation portion has a size that satisfies the following in equation:

$$5d(1/\sin \alpha - 1/\tan \alpha) \leq (b_1 + 2b_2) \quad (5)$$

where d represents a height difference between the top surface of the molded encapsulation portion and the top of the damping structure, a represents an angle of inclination of the inclined inner side surface with respect to the photosensitive area, $b_1$ represents a distance between the opposite inclined inner side surfaces on the damping structure, and $b_2$ represents a length of an orthographic projection of the inclined inner side surface on a plane encompassing the photosensitive area.

The difference between the above-mentioned formula (5) and formula (2) lies only in that in the formula (5), d represents the height difference between the top surface of the molded encapsulation portion and the top of the damping structure, and $b_1$ represents the distance between the opposite inclined inner side surfaces on the damping structure; while in the formula (2), d represents the height difference between the top surface of the molded encapsulation portion and the photosensitive area of the photosensitive element, and $b_1$ represents the distance between the opposite inclined inner side surfaces on the photosensitive area.

According to an embodiment of the present application, the molded encapsulation portion has a size that satisfies the following in equation:

$$d_1(1/\sin \alpha_1 - 1/\tan \alpha_1) + d_2(1/\sin \alpha_2 - 1/\tan \alpha_2) \leq 0.4(b_1 + b_2 + b_3) \quad (5')$$

where $d_1$ and $d_2$ represent height differences between the top surface of the molded encapsulation portion and the top of the damping structure, $\alpha_1$ and $\alpha_2$ represent angles of inclination of the inclined inner side surface with respect to the photosensitive area, $b_1$ represents a distance between the opposite inclined inner side surfaces on the damping structure, and $b_2$ and $b_3$ represent lengths of orthographic projections of the inclined inner side surface on a plane encompassing the photosensitive area.

The difference between the above-mentioned formula (5') and formula (5) lies in that the implementation expressed by the formula (5) is a case of the implementation expressed by the formula (5') when $d_1 = d_2$, $\alpha_1 = \alpha_2$, and $b_2 = b_3$.

Although the foregoing descriptions include many specific configurations and parameters, it should be noted that these specific configurations and parameters are merely used for describing an embodiment of the present application and should not be construed as limiting the scope of the present application. It should be understood by those skilled in the art that various modifications, additions, and replacements may be made without departing from the scope and spirit of the present application. The scope of the present application shall be subject to the appended claims.

What is claimed is:

1. An imaging assembly, comprising:
a photosensitive element having a photosensitive area;
a molded encapsulation portion formed around the photosensitive area and in contact with the photosensitive element, and the molded encapsulation portion has an inclined inner side surface and a top surface higher than the photosensitive area; and
a damping structure interposed between the photosensitive element and the inclined inner side surface,
wherein a height difference between the top surface of the molded encapsulation portion and a top of the damping structure is less than or equal to 0.7 mm, and the inclined inner side surface and the top surface of the molded encapsulation portion have different surface roughnesses.

2. The imaging assembly according to claim 1, wherein the damping structure is a stepped adhesive and/or a filter element.

3. The imaging assembly according to claim 1, wherein a reflectance of the inclined inner side surface of the molded encapsulation portion to visible light is less than or equal to 5%.

4. The imaging assembly according to claim 1, wherein an arithmetic mean deviation of a surface roughness profile of the inclined inner side surface of the molded encapsulation portion is greater than or equal to 1 μm.

5. The imaging assembly according to claim 1, wherein an arithmetic mean deviation of a surface roughness profile of the top surface of the molded encapsulation portion is greater than an arithmetic mean deviation of a surface roughness profile of the inclined inner side surface.

6. The imaging assembly according to claim 1, wherein an angle of inclination of the inclined inner side surface with respect to the photosensitive area is between 20 and 70 degrees.

7. The imaging assembly according to claim 1, wherein the molded encapsulation portion has a size that satisfies the following inequation:

$$5d(1/\sin \alpha - 1/\tan \alpha) \leq (b1 + 2b2),$$

wherein, d represents a height difference between the top surface of the molded encapsulation portion and the top of the damping structure, a represents an angle of inclination of the inclined inner side surface with respect to the photosensitive area, b1 represents a distance between the opposite inclined inner side surfaces on the damping structure, and b2 represents a length of an orthographic projection of the inclined inner side surface on a plane encompassing the photosensitive area.

8. The imaging assembly according to claim 1, wherein the molded encapsulation portion has a size that satisfies the following inequation:

$$d1(1/\sin \alpha1 - 1/\tan \alpha1) + d2(1/\sin \alpha2 - 1/\tan \alpha2) \leq 0.4(b1 + b2 + b3),$$

wherein, d1 and d2 represent height differences between the top surface of the molded encapsulation portion and the top of the damping structure, a1 and a2 represent angles of inclination of the inclined inner side surface with respect to the photosensitive area, b1 represents a distance between the opposite inclined inner side surfaces on the damping structure, and b2 and b3 represent lengths of orthographic projections of the inclined inner side surface on a plane encompassing the photosensitive area.

9. A method for fabricating an imaging assembly, comprising:
mounting a photosensitive element on a circuit board of an imaging assembly to be fabricated;
attaching a damping structure to the photosensitive element;
attaching a flexible film to a lower portion of a molding mold, wherein the flexible film has a non-smooth surface facing away from the molding mold, the lower portion of the molding mold comprises a pressure head and a module portion located around the pressure head, and the pressure head has an inwardly inclined surface at an edge of the pressure head;

disposing the molding mold with the flexible film onto the damping structure, so that a height difference between a bottom surface of the module portion facing the photosensitive element and a top of the damping structure is less than or equal to 0.7 mm; and molding a molded encapsulation portion around the photosensitive element, between the bottom surface of the module portion facing the photosensitive element and the top surface of the photosensitive element, and surrounding the inwardly inclined surface at the edge of the pressure head, so that an inclined inner side surface formed on the molded encapsulation portion adjacent to the inwardly inclined surface has a non-smooth surface corresponding to the non-smooth surface of the flexible film attached on the inwardly inclined surface.

10. The method according to claim 9, wherein the damping structure is a stepped adhesive and/or a filter element.

11. The method according to claim 9, wherein a reflectance of the inclined inner side surface of the molded encapsulation portion to visible light is less than or equal to 5%.

12. The method according to claim 9, wherein an arithmetic mean deviation of a surface roughness profile of the inclined inner side surface of the molded encapsulation portion is greater than or equal to 1 μm.

13. The method according to claim 9, wherein an arithmetic mean deviation of a surface roughness profile of the non-smooth surface of the flexible film attached on the module portion is greater than an arithmetic mean deviation of a surface roughness profile of the non-smooth surface of the flexible film attached on the inwardly inclined surface.

14. The method according to claim 9, wherein the disposing the molding mold with the flexible film onto the damping structure comprises: pressing the pressure head with the flexible film directly against the damping structure.

15. The method according to claim 9, wherein an angle of inclination of the inwardly inclined surface with respect to the photosensitive area is between 20 and 70 degrees.

16. The method according to claim 9, wherein after the flexible film is attached to the lower portion of the molding mold, a resulting stretching coefficient K of the flexible film is less than or equal to 1.4, wherein $$K=1+2d(1/\sin \alpha - 1/\tan \alpha)/(b1+2b2),$$

wherein, d represents a height difference between the bottom surface of the module portion facing the photosensitive element and the top of the damping structure, a represents an angle of inclination of the inwardly inclined surface with respect to the photosensitive area, b1 represents a distance between the inwardly inclined surfaces of the pressure head, and b2 represents a length of an orthographic projection of the inwardly inclined surface on a plane encompassing the photosensitive area.

17. The method according to claim 9, wherein after the flexible film is attached to the lower portion of the molding mold, a resulting stretching coefficient K of the flexible film is less than or equal to 1.4, wherein $$K=1+(d1(1/\sin \alpha1 - 1/\tan \alpha1)+d2(1/\sin \alpha2 - 1/\tan \alpha2))/(b1+b2+b3),$$

wherein, d1 and d2 represent height differences between the bottom surface of the module portion facing the photosensitive element and the top of the damping structure, a1 and a2 represent angles of inclination of the inwardly inclined surface with respect to the photosensitive area, b1 represents a distance between the inwardly inclined surfaces of the pressure head, and b2 and b3 represent lengths of orthographic projections of the inwardly inclined surface on a plane encompassing the photosensitive area.

18. The method according to claim 9, wherein the flexible film has an anti-adhesive surface facing toward the molding mold.

19. The method according to claim 9, wherein the flexible film is made of one or more materials selected from group consisting of ETFE, PTFE, PFA, FEP, and PS.

* * * * *